US007670450B2

(12) United States Patent
Lamansky et al.

(10) Patent No.: US 7,670,450 B2
(45) Date of Patent: Mar. 2, 2010

(54) PATTERNING AND TREATMENT METHODS FOR ORGANIC LIGHT EMITTING DIODE DEVICES

(75) Inventors: Sergey A. Lamansky, Apple Valley, MN (US); Erika Bellmann, Berlin (DE); Ha T. Le, St. Paul, MN (US); John S. Staral, Woodbury, MN (US); John P. Baetzold, North St. Paul, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 698 days.

(21) Appl. No.: 11/461,194

(22) Filed: Jul. 31, 2006

(65) Prior Publication Data

US 2008/0026306 A1 Jan. 31, 2008

(51) Int. Cl.
*B44C 1/17* (2006.01)
*B41M 5/40* (2006.01)

(52) U.S. Cl. ................. 156/235; 427/372.2; 428/32.81; 428/690; 430/945; 503/227

(58) Field of Classification Search ....................... None
See application file for complete search history.

(56) References Cited

U.S. PATENT DOCUMENTS 4,252,671 A 2/1981 Smith
4,722,583 A 2/1988 Stewart
4,822,643 A 4/1989 Chou et al.
4,833,124 A 5/1989 Lum
4,839,224 A 6/1989 Chou et al.
4,912,083 A 3/1990 Chapman et al.
4,940,640 A 7/1990 MacDiarmid
4,942,141 A 7/1990 DeBoer et al.
4,948,776 A 8/1990 Evans et al.
4,948,778 A 8/1990 DeBoer
4,950,639 A 8/1990 DeBoer et al.
4,952,552 A 8/1990 Chapman et al.
5,023,229 A 6/1991 Evans et al.

(Continued)

FOREIGN PATENT DOCUMENTS

EP 321 923 6/1989

(Continued)

OTHER PUBLICATIONS

Bello, K.A. et al., "Near-infrared-absorbing Squaraine Dyes containing 2,3-Dihydroperimindine Terminal Groups," *J. Chem. Soc.*, Chem. Comm., pp. 452-454 (1993).

(Continued)

*Primary Examiner*—Bruce H Hess

(57) ABSTRACT

A thermal transfer donor element is provided which can include a support, light-to-heat conversion layer, interlayer, and transfer layer. When the donor element is brought into contact with a receptor and imagewise irradiated, an image is obtained which is free from contamination by the light-to-heat conversion layer. In order to enhance the lifetimes of the transferred material, thermal treatments such as annealing are applied to the receptor before transfer, to the transfer layer after transfer, or a combination of them. The construction and process of the donor element is useful in making colored images including applications such as color proofs, color filter elements, and organic light emitting diode displays and devices.

8 Claims, 1 Drawing Sheet

106
104
102
108
100

U.S. PATENT DOCUMENTS

| | | | |
|---|---|---|---|
| 5,024,990 | A | 6/1991 | Chapman et al. |
| 5,061,569 | A | 10/1991 | VanSlyke et al. |
| 5,089,372 | A | 2/1992 | Kirihata et al. |
| 5,156,938 | A | 10/1992 | Foley et al. |
| 5,166,024 | A | 11/1992 | Bugner et al. |
| 5,171,650 | A | 12/1992 | Ellis et al. |
| 5,244,770 | A | 9/1993 | DeBoer et al. |
| 5,256,506 | A | 10/1993 | Ellis et al. |
| 5,278,023 | A | 1/1994 | Bills et al. |
| 5,286,604 | A | 2/1994 | Simmons, III |
| 5,308,737 | A | 5/1994 | Bills et al. |
| 5,318,938 | A | 6/1994 | Hampl, Jr. et al. |
| 5,340,699 | A | 8/1994 | Haley et al. |
| 5,351,617 | A | 10/1994 | Williams et al. |
| 5,360,694 | A | 11/1994 | Thien et al. |
| 5,387,496 | A | 2/1995 | DeBoer |
| 5,401,607 | A | 3/1995 | Takiff et al. |
| 5,501,938 | A | 3/1996 | Ellis et al. |
| 5,521,035 | A | 5/1996 | Wolk et al. |
| 5,593,808 | A | 1/1997 | Ellis |
| 5,605,780 | A | 2/1997 | Burberry et al. |
| 5,612,165 | A | 3/1997 | Ellis |
| 5,622,795 | A | 4/1997 | Ellis |
| 5,685,939 | A | 11/1997 | Wolk et al. |
| 5,691,098 | A | 11/1997 | Busman et al. |
| 5,691,114 | A | 11/1997 | Burberry et al. |
| 5,693,446 | A | 12/1997 | Staral et al. |
| 5,695,907 | A | 12/1997 | Chang |
| 5,707,745 | A | 1/1998 | Forrest et al. |
| 5,710,097 | A | 1/1998 | Staral et al. |
| 5,725,989 | A | 3/1998 | Chang et al. |
| 5,828,488 | A | 10/1998 | Ouderkirk et al. |
| 5,863,860 | A | 1/1999 | Patel et al. |
| 5,882,774 | A | 3/1999 | Jonza et al. |
| 5,998,085 | A | 12/1999 | Isberg et al. |
| 6,027,849 | A | 2/2000 | Vogel |
| 6,099,893 | A | 8/2000 | Lee et al. |
| 6,114,088 | A | 9/2000 | Wolk et al. |
| 6,186,067 | B1 | 2/2001 | Rorke et al. |
| 6,190,826 | B1 | 2/2001 | Chang et al. |
| 6,194,119 | B1 | 2/2001 | Wolk et al. |
| 6,214,520 | B1 | 4/2001 | Wolk et al. |
| 6,221,543 | B1 | 4/2001 | Guehler et al. |
| 6,228,543 | B1 | 5/2001 | Mizuno et al. |
| 6,228,555 | B1 | 5/2001 | Hoffend, Jr. et al. |
| 6,242,152 | B1 | 6/2001 | Staral et al. |
| 6,284,425 | B1 | 9/2001 | Staral et al. |
| 6,291,126 | B2 | 9/2001 | Wolk et al. |
| 6,358,664 | B1 | 3/2002 | Nirmal et al. |
| 6,410,201 | B2 | 6/2002 | Wolk et al. |
| 6,461,775 | B1 | 10/2002 | Pokorny et al. |
| 6,461,787 | B2 | 10/2002 | Warner et al. |
| 6,468,715 | B2 | 10/2002 | Hoffend, Jr. et al. |
| 6,482,564 | B2 | 11/2002 | Nirmal et al. |
| 6,485,884 | B2 | 11/2002 | Wolk et al. |
| 6,521,324 | B1 | 2/2003 | Debe et al. |
| 6,586,153 | B2 | 7/2003 | Wolk et al. |
| 6,699,597 | B2 | 3/2004 | Bellmann et al. |
| 6,855,384 | B1 | 2/2005 | Nirmal et al. |
| 6,855,636 | B2 | 2/2005 | Theiss et al. |
| 6,921,614 | B2 | 7/2005 | Andrews et al. |
| 7,408,192 | B2 * | 8/2008 | Kang .......................... 257/59 |
| 2003/0054197 | A1 | 3/2003 | Kwong |
| 2004/0191564 | A1 | 9/2004 | Kim et al. |
| 2005/0287315 | A1 | 12/2005 | Kreilich et al. |

FOREIGN PATENT DOCUMENTS

| | | |
|---|---|---|
| EP | 568 993 | 11/1993 |
| EP | 1 178 546 A2 | 2/2002 |
| WO | WO 95/17303 | 6/1995 |
| WO | WO 97/15173 | 4/1997 |
| WO | WO 98/03346 | 1/1998 |
| WO | WO 99/46961 | 9/1999 |
| WO | WO 2004/033583 A | 4/2004 |

OTHER PUBLICATIONS

Grulke, E., "Solubility Parameter Values," *Polymer Handbook*, pp. VII 519-559 (1989).

Tsutsui, T., "Progress in Electroluminescent Devices Using Molecular Thin Films," *MRS Bulletin*, vol. 22, pp. 39-45 (Jun. 1997).

Kido, J., "Organic Electroluminescent devices Based on Polymeric Materials", *Trends in Polymer Science*, vol. 2, pp. 350-355 (1994).

Halls et al., J.J.M., "Light-emitting and photoconductivity diodes fabricated with conjugated polymers," *Thin Solid Films*, vol. 276, pp. 13-20 (1996).

Chen et al., C.H., "Recent Developments in Molecular Organic Electroluminescent Materials", Macromol. Symp., vol. 125, pp. 1-48 (1997).

Pei et al., Q., "Polymer Light-Emitting Electrochemical Cells: In Situ Formation of a Light-Emitting p-n Junction," *J. Amer. Chem. Soc.*, vol. 118, pp. 3922-3929 (1996).

Shen et al., Z., "Three-Color, Tunable, Organic Light-Emitting Devices," *Science*, vol. 276, pp. 2009-2011 (1997).

Caria et al., S., "Enhanced light emission efficiency and current stability by morphology control and thermal annealing of organic light emitting diode devices," *Journal of Physics: Condensed Matter*, vol. 18, pp. S2139-S2147 (Aug. 4, 2006).

Chan et al., M. Y., "Efficiency enhancement and retarded dark-spots growth of organic light-emitting devices by high-temperature processing," *Chemical Physics Letters*, vol. 371, pp. 700-706 (2003).

Mathai et al., M. K., "Correlating Physical and Chemical Degradation in the Performance of Aluminum *tris* (8-Hydroxyquinoline) ($Alq_3$)-Based OLEDs," *Journal of Macromolecular Science*, vol. 41, No. 12, pp. 1425-1435 (2004).

Sun et al., M.C., "Enhancing the performance of organic light-emitting devices by selective thermal treatment," *Thin Solid Films*, vol. 491 pp. 260-263 (May 19, 2005).

Chen et al. C.-W., "Fuzzy-junction organic light-emitting devices," *Applied Physics Letters*, vol. 81, No. 9, pp. 1570-1572 (Aug. 26, 2002).

U.S. Appl. No. 11/246,811, entitled "Radiation Curable Thermal Transfer Elements," filed Oct. 7, 2005.

U.S. Appl. No. 09/231,724, entitled "Thermal Transfer Element With Novel Light-to-Heat Conversion Layer," filed Jan. 15, 1999.

U.S. Appl. No. 09/312,504, entitled "Process for Making Active Substrates for Color Displays," filed May 14, 1999.

* cited by examiner

PATTERNING AND TREATMENT METHODS FOR ORGANIC LIGHT EMITTING DIODE DEVICES

FIELD OF INVENTION

The present invention relates to thermal transfer imaging elements for use in a laser induced thermal imaging (LITI) or equivalent process. In particular, it relates to laser addressable thermal transfer elements having a radiation-absorbing/thermal conversion layer and a transferable layer.

BACKGROUND

With the increase in electronic imaging information capacity and use, a need for imaging systems capable of being addressed by a variety of electronic sources is also increasing. Examples of such imaging systems include thermal transfer, ablation (or transparentization) and ablation-transfer imaging. These imaging systems have been shown to be useful in a wide variety of applications, such as color proofing, color filter arrays for liquid crystal display devices, printing plates, and reproduction masks.

The traditional method of recording electronic information with a thermal transfer imaging medium utilizes a thermal printhead as the energy source. The information is transmitted as electrical energy to the printhead causing a localized heating of a thermal transfer donor sheet which then transfers material corresponding to the image data to a receptor sheet. The two primary types of thermal transfer donor sheets are dye sublimation (or dye diffusion transfer) and thermal mass transfer. Representative examples of these types of imaging systems are described in U.S. Pat. Nos. 4,839,224 and 4,822,643. The use of thermal printheads as an energy source suffers several disadvantages, such as size limitations of the printhead, slow image recording speeds (milliseconds), limited resolution, limited addressability, and artifacts on the image from detrimental contact of the media with the printhead.

The increasing availability and use of higher output compact lasers, semiconductor light sources, laser diodes and other radiation sources which emit in the ultraviolet, visible and particularly in the near-infrared and infrared regions of the electromagnetic spectrum, have allowed the use of these sources as viable alternatives for the thermal printhead as an energy source. The use of a radiation source such as a laser or laser diode as the imaging source is one of the primary and preferred means for transferring electronic information onto an image recording media. The use of radiation to expose the media provides higher resolution and more flexibility in format size of the final image than the traditional thermal printhead imaging systems. In addition, radiation sources such as lasers and laser diodes provide the advantage of eliminating the detrimental effects from contact of the media with the heat source. As a consequence, a need exists for media that have the ability to be efficiently exposed by these sources and have the ability to form images having high resolution and improved edge sharpness.

It is well known in the art to incorporate light-absorbing layers in thermal transfer constructions to act as light-to-heat converters, thus allowing non-contact imaging using radiation sources such as lasers and laser diodes as energy sources. Representative examples of these types of elements are described in U.S. Pat. Nos. 5,308,737; 5,278,023; 5,256,506; and 5,156,938. The transfer layer may contain light absorbing materials such that the transfer layer itself functions as the light-to-heat conversion layer. Alternatively, the light-to-heat conversion layer may be a separate layer, for instance a separate layer between the substrate and the transfer layer.

Constructions in which the transfer layer itself functions as the light-to-heat conversion layer may require the addition of an additive to increase the absorption of incident radiation and effect transfer to a receptor. In these cases, the presence of the absorber in the transferred image may have a detrimental effect upon the performance of the imaged object (e.g., visible absorption which reduces the optical purity of the colors in the transferred image, reduced transferred image stability, incompatibility between the absorber and other components present in the imaging layer, etc.). In other cases the transfer layer may comprise at least one component inherently absorbing of the incident radiation.

Contamination of the transferred image by the light-to-heat conversion layer itself is often observed when using donor constructions having a separate light-to-heat conversion layer. In the cases where contamination of the transferred image by such unintended transfer of the light-to-heat conversion layer occurs and the light-to-heat conversion layer possesses an optical absorbance or other property that interferes with the performance of the transferred image (e.g., transfer of a portion of a black body light-to-heat conversion layer to a color filter array or color proof, transfer of a conductive light-to-heat conversion layer to an electronic component, etc.), the incidental transfer of the light-to-heat conversion layer to the receptor is particularly detrimental to quality of the imaged article. Similarly, mechanical or thermal distortion or other damage of the light-to-heat conversion layer during imaging may occur and negatively impact the quality of the transferred coating.

U.S. Pat. No. 5,171,650 discloses methods and materials for thermal imaging using an "ablation-transfer" technique. The donor element used in the imaging process comprises a support, an intermediate dynamic release layer, and an ablative carrier topcoat. Both the dynamic release layer and the transfer layer may contain an infrared-absorbing (light to heat conversion) dye or pigment. An image is produced by placing the donor element in intimate contact with a receptor and then irradiating the donor with a coherent light source in an imagewise pattern.

U.S. Pat. No. 6,027,849 discloses ablative imaging elements comprising a substrate coated on a portion thereof with an energy sensitive layer comprising a glycidyl azide polymer in combination with a radiation absorber. Demonstrated imaging sources included infrared, visible, and ultraviolet lasers. Solid state lasers were disclosed as exposure sources, although laser diodes were not specifically mentioned. This application is primarily concerned with the formation of relief printing plates and lithographic plates by ablation of the energy sensitive layer. No specific mention of utility for thermal mass transfer was made.

U.S. Pat. No. 5,308,737 discloses the use of black metal layers on polymeric substrates with gas-producing polymer layers which generate relatively high volumes of gas when irradiated. The black metal (e.g., black aluminum) absorbs the radiation efficiently and converts it to heat for the gas-generating materials. It is observed in the examples that in some cases the black metal was eliminated from the substrate, leaving a positive image on the substrate.

U.S. Pat. No. 5,278,023 discloses laser-addressable thermal transfer materials for producing color proofs, printing plates, films, printed circuit boards, and other media. The materials contain a substrate coated thereon with a propellant layer wherein the propellant layer contains a material capable of producing nitrogen ($N_2$) gas at a temperature of preferably less than about 300° C.; a radiation absorber; and a thermal mass transfer material. The thermal mass transfer material may be incorporated into the propellant layer or in an additional layer coated onto the propellant layer. The radiation absorber may be employed in one of the above-disclosed layers or in a separate layer in order to achieve localized heating with an electromagnetic energy source, such as a laser. The thermal mass transfer material may contain, for example, pigments, toner particles, resins, metal particles, monomers, polymers, dyes, or combinations thereof. Also disclosed is a process for forming an image as well as an imaged article made thereby.

Laser-induced mass transfer processes have the advantage of very short heating times (typically nanoseconds to milliseconds), whereas the conventional thermal mass transfer methods are relatively slow due to the longer dwell times (typically milliseconds) required to heat the printhead and transfer the heat to the donor. The transferred images generated under laser-induced ablation imaging conditions are often fragmented (being propelled from the surface as particulates or fragments) and/or distorted during the imaging process. The images generated under non-ablative or partially ablative imaging conditions (e.g., under thermal melt stick transfer conditions) may also show deformities on the surface of the transferred material. Therefore, there is a need for a thermal transfer system that takes advantage of the speed and efficiency of laser addressable systems without sacrificing image quality or resolution.

SUMMARY OF INVENTION

A first process for transferring an image onto a receptor, consistent with the present invention, includes the following steps: providing on a substrate a light-to-heat conversion layer and a transfer layer coated on the light-to-heat conversion layer; placing the transfer layer in contact with a surface of the receptor; irradiating the light-to-heat conversion layer in an imagewise pattern with a light source to thermally transfer portions of the transfer layer corresponding to the imagewise pattern to the receptor; and annealing at least one layer on the receptor prior to the irradiating step.

A second process for transferring an image onto a receptor, consistent with the present invention, includes the following steps: providing on a substrate a light-to-heat conversion layer and a transfer layer coated on the light-to-heat conversion layer; placing the transfer layer in contact with a surface of the receptor; irradiating the light-to-heat conversion layer in an imagewise pattern with a light source to thermally transfer portions of the transfer layer corresponding to the imagewise pattern to the receptor; annealing at least one layer on the receptor prior to the irradiating step; and performing a thermal treatment on the portions of the transfer layer after transfer to the receptor.

A process for forming an organic light emitting diode device, consistent with the present invention, includes the following steps: applying a hole injection layer on a receptor; annealing the hole injection layer; applying a hole transport layer on the receptor; annealing the hole transport layer; providing on a substrate a light-to-heat conversion layer and a transfer layer coated on the light-to-heat conversion layer; placing the transfer layer in contact with a surface of the receptor; irradiating the light-to-heat conversion layer in an imagewise pattern with a light source to thermally transfer portions of the transfer layer corresponding to the imagewise pattern to the receptor.

BRIEF DESCRIPTION OF THE DRAWINGS

The accompanying drawing is incorporated in and constitutes a part of this specification and, together with the description, explains the advantages and principles of the invention. In the drawing.

DETAILED DESCRIPTION

Figure 1:
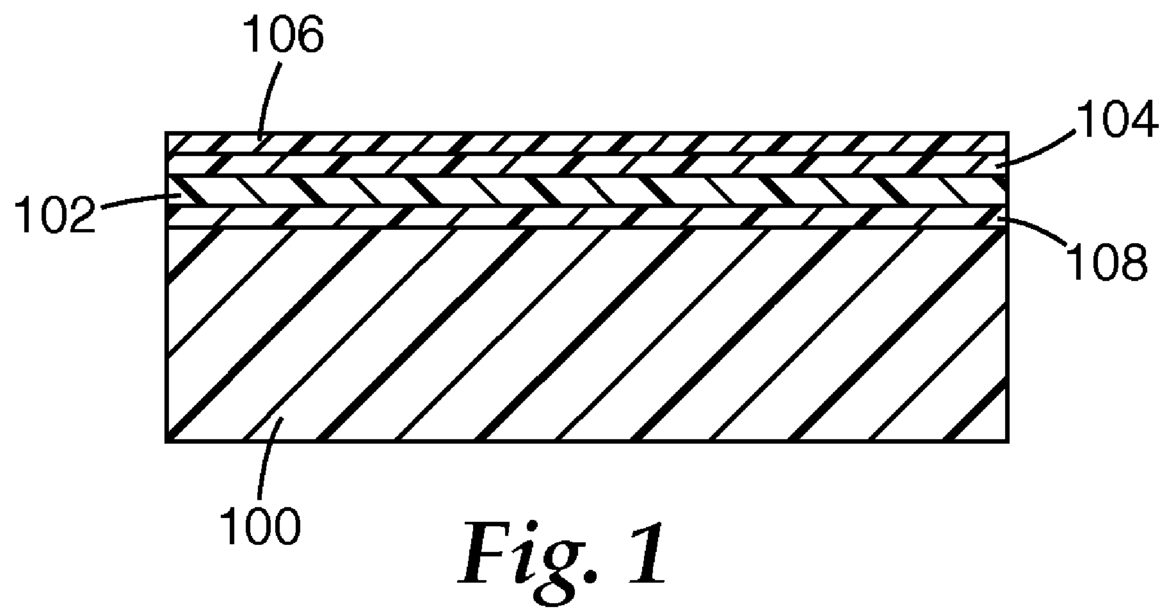
FIG. 1 is a diagram illustrating an example of LITI donor film.

The present specification relates to patterning methods for LITI transfer layers used in LITI donor films. The LITI donor films may be used in the formation or partial formation of devices and other objects using thermal transfer and thermal transfer elements for forming the devices or other articles. As a particular example, a thermal transfer element can be formed for making, at least in part, a multilayer device, such as a multilayer active device and passive device, for example as multilayer electronic and optical devices. This process can be accomplished, for example, by thermal transfer of a multicomponent transfer assembly from a thermal transfer element to a final receptor. It will be recognized that single layer and other multilayer transfers can also be used to form devices and other articles.

An order in the present specification (e.g., an order of steps to be performed or an order of layers on a substrate) is not meant to preclude intermediates between the items specified. Furthermore, as used herein:

The term "active device" includes an electronic or optical component capable of a dynamic function, such as amplification, oscillation, or signal control, and may require a power supply for operation.

The term "microelectronic device" includes an electronic or optical component that can be used alone and/or with other components to form a larger system, such as an electronic circuit. The term "passive device" includes an electronic or optical component that is basically static in operation (i.e., it is ordinarily incapable of amplification or oscillation) and may require no power for characteristic operation.

Thermal Transfer Elements

As shown in FIG. 1, an exemplary LITI donor film includes a donor substrate 100 for mechanical support, an optional LTHC layer 102 overlaying the substrate 100 and used for transforming imaging radiation into heat and a transfer layer 106. Other layers may include, for example, an optional interlayer 104 overlaying the substrate, and an optional underlayer 108 interposed between the substrate 100 and the LTHC layer 102. The term "overlaying" refers to a first layer on top of a second layer, possibly with intervening layers between the first and second layers. The step of applying a layer on a receptor or substrate includes possibly applying the layer with intervening layers between the layer and the receptor or substrate.

Substrate and Optional Primer Layer

Generally, the LITI donor thermal transfer element includes a substrate. The donor substrate can be, for example, glass, a transparent film or a polymer film. One suitable type of polymer film is a polyester film, for example, polyethylene terephthalate (PET) or polyethylene naphthalate (PEN) films. However, other films include those having appropriate optical properties if radiation of the donor is performed from the side opposite the receptor, including high transmission of light at a particular wavelength as well as sufficient mechanical and thermal stability for the particular application. The substrate may itself contain an imaging radiation absorber material, in which case a portion of the substrate such as the top layer, or the whole substrate (e.g., if the absorber is homogeneous throughout the substrate), can function as the LTHC layer. In that case, the substrate is optional in that the LTHC also functions as a substrate. Optionally, the surface of the substrate may be modified by surface treatments (for example, air- or nitrogen-corona, plasma, etc.) known to those skilled in the art to control the surface properties (for example, adhesive properties, surface texture, surface tension, etc.) of the substrate prior to overlaying subsequent layers on the substrate.

The donor substrate, in at least some instances, is substantially planar so that uniform coatings can be formed. The typical thickness of the donor substrate ranges from 0.025 millimeters (mm) to 0.15 mm, preferably 0.05 mm to 0.1 mm, although thicker or thinner donor substrates may be used.

Typically, the materials used to form the donor substrate and any adjacent layer(s) can be selected to improve adhesion between the donor substrate and the adjacent layer(s), control temperature transport between the substrate and the adjacent layer, and control imaging radiation transport to the LTHC layer. However, an optional priming layer can be used to increase uniformity during the coating of subsequent layers onto the substrate or increase the bonding strength between the donor substrate and adjacent layers. One example of a suitable substrate with primer layer is Product No. M7Q (available from DuPont Teijin Films, Osaka, Japan).

Optional Underlayer

An optional underlayer may be coated or otherwise disposed between a donor substrate and the LTHC layer to minimize damage to the donor substrate during imaging, for example. The underlayer can also influence adhesion of the LTHC layer to the donor substrate element. Typically, the underlayer has high thermal resistance (i.e., a lower thermal conductivity than the substrate) and acts as a thermal insulator to protect the substrate from heat generated in the LTHC layer. Alternatively, an underlayer that has a higher thermal conductivity than the substrate can be used to enhance heat transport from the LTHC layer to the substrate, for example to reduce the occurrence of imaging defects that can be caused by LTHC layer overheating.

Suitable underlayers include, for example, polymer films, metal layers (e.g., vapor deposited metal layers), inorganic layers (e.g., sol-gel deposited layers and vapor deposited layers of inorganic oxides (e.g., silica, titania, aluminum oxide and other metal oxides)), and organic/inorganic composite layers. Organic materials suitable as underlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the donor substrate or LTHC layer as, for example, thermoplastic precursors and subsequently crosslinked to form a crosslinked underlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (e.g., solvent coating or spray coating). The underlayer may be either transmissive, absorptive, reflective, or some combination thereof, to one or more wavelengths of imaging radiation.

Inorganic materials suitable as underlayer materials include, for example, metals, metal oxides, metal sulfides, and inorganic carbon coatings, including those materials that are transmissive, absorptive, or reflective at the imaging light wavelength. These materials may be coated or otherwise applied via conventional techniques (e.g., vacuum sputtering, vacuum evaporation, or plasma jet deposition).

The underlayer may provide a number of benefits. For instance, the underlayer may be used to manage or control heat transport between the LTHC layer and the donor substrate. An underlayer may be used to insulate the substrate from heat generated in the LTHC layer or to transport heat away from the LTHC layer toward the substrate. Temperature management and heat transport in the donor element can be accomplished by adding layers and/or by controlling layer properties such as thermal conductivity (e.g., either or both the value and the directionality of thermal conductivity), distribution and/or orientation of absorber material, or the morphology of layers or particles within layers (e.g., the orientation of crystal growth or grain formation in metallic thin film layers or particles).

The underlayer may contain additives, including, for example, photoinitiators, surfactants, pigments, plasticizers, and coating aids. The thickness of the underlayer may depend on factors such as, for example, the material of the underlayer, the material and optical properties of the LTHC layer, the material of the donor substrate, the wavelength of the imaging radiation, the duration of exposure of the thermal transfer element to imaging radiation, and the overall donor element construction. For a polymeric underlayer, the thickness of the underlayer typically is in the range of 0.05 micron to 10 microns, more preferably from about 0.1 micron to 4 microns, more preferably from about 0.5 micron to 3 microns, and more preferably from about 0.8 micron to 2 microns. For inorganic underlayers (e.g., metal or metal compound underlayer), the thickness of the underlayer typically is in the range of 0.005 micron to 10 microns, more preferably from about 0.01 micron to 4 microns, and more preferably from about 0.02 micron to 2 microns.

A more detailed description of LITI donor underlayers is found in U.S. Pat. No. 6,284,425, which is incorporated herein by reference.

Light-to-Heat Conversion (LTHC) Layers

For radiation-induced thermal transfer, an optional separate LTHC layer may be incorporated within the thermal transfer donor to couple the energy of light radiated from a light-emitting source into the thermal transfer donor. The LTHC layer typically includes an imaging radiation absorber material that absorbs incident radiation and converts at least a portion of the incident radiation into heat to enable transfer of the transfer layer from the thermal transfer donor to the receptor. In some cases, the thermal transfer element may comprise a LTHC layer and also include additional imaging radiation absorber material(s) disposed in one or more of the other layers of the thermal transfer donor, for example the donor substrate, a transfer layer, or an optional interlayer. In other cases, a separate LTHC layer may not be present and the radiation absorber may be disposed in one or more of the other layers of the thermal transfer donor, for example the donor substrate, a transfer layer, or an optional interlayer. In still further cases one or more radiation absorbers may be disposed in the receptor instead of, or in addition to, incorporation of one or more radiation absorbers in the donor.

Typically, the imaging radiation absorber material in the LTHC layer (or other layers) absorbs light in the infrared, visible, and/or ultraviolet regions of the electromagnetic spectrum, or within a particular range of wavelengths. The imaging radiation absorber material is absorptive of the selected imaging radiation and present in the thermal transfer element at a level sufficient to provide an optical absorbance at the wavelength of the imaging radiation in the range of 0.2 to 3, and preferably from 0.5 to 2. Typical radiation absorbing materials can include, for example, dyes (e.g., visible dyes, ultraviolet dyes, infrared dyes, fluorescent dyes, and radiation-polarizing dyes), pigments, organic pigments, inorganic pigments, metals, metal compounds, metal films, a ferricyanide pigment, a phthalocyanine pigment, a phthalocyanine dye, a cyanine pigment, a cyanine dye, a metal dithiolene pigment, a metal dithiolene dye and other absorbing materials.

Examples of typical imaging radiation absorber materials can include carbon black, metal oxides, and metal sulfides. One example of a typical LTHC layer can include a pigment such as carbon black, and a binder such as an organic polymer. Another typical LTHC layer can include metal or metal/metal oxide formed as a thin film, for example, black aluminum (i.e., a partially oxidized aluminum). Metallic and metal compound films may be formed by techniques, such as, for example, sputtering and evaporative deposition. Particulate coatings may be formed using a binder and any suitable dry or wet coating techniques.

Dyes typical for use as imaging radiation absorber materials in an LTHC layer may be present in particulate form, dissolved in a binder material, or at least partially dispersed in a binder material. When dispersed particulate imaging radiation absorber materials are used, the particle size can be, at least in some instances, about 10 microns or less, and may be about 1 micron or less. Typical dyes include those dyes that absorb in the IR region of the spectrum. Examples of such dyes are described in the following: Matsuoka, M., "Infrared Absorbing Dyes," Plenum Press, New York, 1990; Matsuoka, M., Absorption Spectra of Dyes for Diode Lasers, Bunshin Publishing Co., Tokyo, 1990, U.S. Pat. Nos. 4,722,583; 4,833,124; 4,912,083; 4,942,141; 4,948,776; 4,948,778; 4,950,639; 4,940,640; 4,952,552; 5,023,229; 5,024,990; 5,156,938; 5,286,604; 5,340,699; 5,351,617; 5,360,694; and 5,401,607; European Patent Nos. 321,923 and 568,993; and Beilo, K. A. et al., J. Chem. Soc., Chem. Comm., 1993, 452-454 (1993), all of which are incorporated herein by reference. IR imaging radiation absorber materials include those marketed by H. W. Sands Corporation, Juniper, Fla. 33477. A specific dye may be chosen based on factors such as solubility in and compatibility with a specific binder and/or coating solvent, as well as the wavelength range of absorption.

Pigmentary materials may also be used in the LTHC layer as imaging radiation absorber materials. Examples of typical pigments include carbon black and graphite, as well as phthalocyanines, nickel dithiolenes, and other pigments described in U.S. Pat. Nos. 5,166,024 and 5,351,617, incorporated herein by reference. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as lanthanum, aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-nano-structured oxides, and oxides structurally related to the bronze family (e.g., $WO_2$) may also be used.

Metal imaging radiation absorber materials may be used, either in the form of particulates as described for instance in U.S. Pat. No. 4,252,671, incorporated herein by reference, or as films as disclosed in U.S. Pat. No. 5,256,506, incorporated herein by reference. Typical metals include, for example, aluminum, bismuth, tin, indium, germanium, tellurium and zinc.

A particulate imaging radiation absorber material may be disposed in a binder. The weight percent of the imaging radiation absorber material in the coating, excluding the solvent in the calculation of weight percent, is generally from 1 wt. % to 35 wt. %, more preferably from 3 wt. % to 30 wt. %, and more preferably from 5 wt. % to 25 wt. %, depending on the particular imaging radiation absorber material(s) and binder(s) used in the LTHC.

LTHC layers known in the art generally include a UV-curable resin system and a carbon black pigment dispersion as a small particle absorber material. Carbon black is inexpensive, stable, easily processed, and absorbs at the NIR imaging laser wavelengths of 808 nanometers (nm) and 1064 nm. The spectral characteristics of carbon black generally result in LTHC layers that are difficult to UV cure and difficult to inspect optically during coating. In addition, the coatings are susceptible to thermal damage during the UV curing process due to the same light-to-heat conversion process that occurs during laser thermal printing. The UV lamp exposure includes power throughout the visible, where it is absorbed and converted to heat, even though the curing process is typically sensitized only in the UV. The result is often thermal damage and distortion of the film substrate.

Suitable radiation curable materials include radiation curable monomers, oligomers, polymers and co(polymers), particularly acrylate and meth(acrylate) monomers, oligomers, polymers and co(polymers). The radiation source used to effect curing may be a laser or a flash lamp.

In order to better understand the benefits of the imaging radiation absorber materials of a LITI process, consider the optical properties in three spectral regions: the near-IR (NIR), visible (VIS), and ultraviolet (UV). The laser wavelength will typically fall in the NIR spectral region (700 nm-1100 nm). In order to be an efficient imaging radiation absorber material for a given type of laser, the particle absorber material typically must have a significant absorption band at the laser wavelength. Preferred imaging radiation absorber material materials have effective extinction coefficients at the laser wavelength of at least $10^3$ mL/g-cm, preferably $10^4$ mL/g-cm, and more preferably $10^5$ mL/g-cm.

Thus, examples of imaging radiation absorber materials suitable for use with an 808 nanometer laser include Prussian Blue (Pigment Blue 27), copper phthalocyanine (Pigment Blue 15) and many of its substituted derivatives, metal dithiolenes, and polymethine dyes. Suitable near IR (NIR) imaging radiation absorbers also include solvent soluble cyanine dyes such as S0402, S0337, S0391, S0094, S0325, S0260, S0712, S0726, S0455 and S0728 from FEW Chemicals (Wolfen, Germany); and YKR-2016, YKR-2100, YKR-2012, YKR-2900, D01-014 and D03-002 from Yamamoto Chemicals, Inc. (Tokyo, Japan) as well as soluble polymethine dyes such as Pro-Jet 830 LDI from Avecia (Blackley, Manchester, UK). Other imaging radiation absorbers include water soluble cyanine dyes such as S0121, S0270 and S0378 from FEW Chemicals and both soluble and insoluble phthalocyanine imaging radiation absorbers such as YKR-1020, YKR-220, YKR-1030, YKR-3020, YKR-3071, YKR-4010, YKR-3030, YKR-3070, YKR-369, D05-003 and YKR-5010 from Yamamoto and Pro-Jet 800 NP and Pro-Jet 830 NP from Avecia.

Increased transparency in the visible spectral region (400 nm-700 nm) can be important for both visual and/or optical inspection and alignment. In addition, it may lower the heat load on the LTHC layer and substrate during the UV-cure process, thus reducing substrate deformation and possible degradation due to thermal effects.

The amount of UV energy (from approximately 200 nm-400 nm wavelength) transmitted through the LTHC coating relates to the ease with which the LTHC layer can be UV cured, ultimately affecting the level of residuals, cure speed, and potential for thermal distortion of the LTHC layer.

As indicated, a particulate imaging radiation absorber material may be disposed in a binder. The weight percent of the imaging radiation absorber material in the coating, excluding the solvent in the calculation of weight percent, is generally from 1 wt. % to 35 wt. %, more preferably from 3 wt. % to 30 wt. %, and more preferably from 5 wt. % to 25 wt. %, depending on the particular imaging radiation absorber material(s) and binder(s) used in the LTHC.

Optional polymeric binders may be included in the LTHC layer. Suitable polymeric binders for use in the LTHC layer include film-forming polymers, for example, phenolic resins (e.g., novolac, cresol and resole resins), polyvinyl butyral resins, polyvinyl acetates, polyvinyl acetals, polyvinylidene chlorides, polyacrylates, cellulosic ethers and esters, nitrocelluloses, polycarbonates, polyesters, polyurethanes, and urethane acrylates. Other suitable binders may include monomers, oligomers, or polymers that have been or can be polymerized or crosslinked. The binder may be primarily formed using a coating of polymerizable or crosslinkable monomers and/or oligomers with optional polymer. When a polymer is used in the binder, the binder includes 1 to 95 wt. %, preferably, 10 to 75 wt. %, polymer (excluding the solvent when calculating wt. %).

Upon coating on the donor substrate, the monomers, oligomers, and polymers are polymerized and/or crosslinked to form the LTHC layer. In some instances, if crosslinking of the LTHC layer is too low, the LTHC layer may be damaged by the heat and/or permit the transfer of a portion of the LTHC layer to the receptor with the transfer layer.

The inclusion of a thermoplastic resin (e.g., polymer) may improve, in at least some instances, the performance (e.g., transfer properties and/or coatability) of the LTHC layer. A thermoplastic resin may improve the adhesion of the LTHC layer to the donor substrate. The binder can include 25 to 95 wt. % (excluding the solvent when calculating wt. %) thermoplastic resin, and preferably, 30 to 50 wt. % thermoplastic resin, although lower amounts of thermoplastic resin may be used (e.g., 1 to 25 wt. %). The thermoplastic resin is typically chosen to be compatible (i.e., form a one-phase combination) with the other materials of the binder. A solubility parameter can be used to indicate compatibility, as described in Polymer Handbook, J. Brandrup, ed., pp. VII 519-557 (1989), incorporated herein by reference. In at least some LTHC layers, a thermoplastic resin that has a solubility parameter in the range of 9 to 13 $(cal/cm^3)^{1/2}$, preferably 9.5 to 12 $(cal/cm^3)^{1/2}$, is chosen for the binder. Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods. A polymeric or organic LTHC layer is coated, in at least some instances, to a thickness of about 0.05 micron to about 20 microns, more preferably of about 0.5 micron to about 10 microns, and more preferably of about 1 micron to about 7 microns. An inorganic LTHC layer is coated, in at least some instances, to a thickness in the range of 0.001 micron to 10 microns, and preferably 0.002 micron to 1 micron.

Radiation absorber material can be uniformly disposed throughout the LTHC layer or can be non-homogeneously distributed. For example, as described in U.S. Pat. No. 6,468,715, incorporated herein by reference, non-homogeneous LTHC layers can be used to control temperature profiles in donor elements. This can give rise to thermal transfer elements that have improved transfer properties (e.g., better fidelity between the intended transfer patterns and actual transfer patterns).

LTHC layers can have a non-homogeneous distribution of absorber material, for example, to control a maximum temperature attained in the donor element and/or to control a temperature attained at the transfer layer interface. For example, an LTHC layer can have absorber material distribution that is less dense closer to the donor substrate and more dense closer to the transfer layer. In many instances, such a design can cause more radiation to be absorbed and converted into heat deeper into the LTHC layer as compared to a homogeneous LTHC layer having the same thickness and optical density. For the sake of clarity, the term "depth" when used to describe a position in the LTHC layer means distance into the LTHC layer in the thickness dimension as measured from the donor substrate side of the thermal mass transfer element. In other instances, it may be beneficial to have an LTHC layer having an absorber material distribution that is more dense closer to the donor substrate and less dense closer to the transfer layer.

LTHC layers can also be formed by combining two or more LTHC layers containing similar or dissimilar materials.

The thermal mass transfer donor elements can include a non-homogeneous LTHC layer. For example, the LTHC layer can have a distribution of absorber material that varies with thickness. In particular, the LTHC layer can have an absorber density that increases with increasing depth. More generally, the LTHC layer can be designed to have a varying absorption coefficient by varying the distribution or density of the same absorber material throughout the LTHC layer, or by including different absorber materials or layers in different locations in the LTHC layer, or both. For the purposes of the present disclosure, the term non-homogeneous includes anisotropic thermal properties or distributions of material(s) in at least one direction in the LTHC layer.

In general, the absorption coefficient is proportional to the rate of absorption of imaging radiation in the LTHC layer. For a homogeneous LTHC layer, the absorption coefficient is constant through the thickness, and the optical density of the LTHC layer is approximately proportional to the total thickness of the LTHC layer multiplied by the absorption coefficient. For non-homogeneous LTHC layers, the absorption coefficient can vary. Exemplary non-homogeneous LTHC layers have an absorption coefficient that varies as a function of thickness of the LTHC layer, and the optical density will depend on the integral of the absorption coefficient taken over the entire LTHC thickness range.

A non-homogeneous LTHC layer can also have an absorption coefficient that varies in the plane of the layer. Additionally, absorber material can be oriented or non-uniformly dispersed in the plane of the LTHC layer to achieve an anisotropic thermal conductivity (e.g., acicular magnetic particles can be used as absorber particles and can be oriented in the presence of a magnetic field). In this manner, an LTHC layer can be made that conducts thermal energy efficiently through the thickness of the layer to transport heat to the transfer layer while having poor thermal conductivity in the plane of the layer so that less heat is dissipated into adjacent, cooler areas, for example those areas that have not been exposed to imaging radiation. Such an anisotropic thermal conductivity might be used to enhance the resolution of thermal patterning using donor elements.

Likewise, any of the other layers of a thermal mass transfer donor element (e.g., substrate, underlayer, interlayer, and/or transfer layer) can be made to have anisotropic thermal conductivities to control heat transport to or away from other layers. One way to make layers having anisotropic thermal conductivities is to have an anisotropic orientation or distribution of materials in the layer, the materials having different thermal conductivities. Another way is impart a surface of one or more layers with a physical structure (e.g., to make a layer thinner in some spots and thicker in others).

By designing LTHC layers to have an absorption coefficient that varies with layer thickness, imaging performance of the donor element can be enhanced. For example, the LTHC layer can be designed so that the maximum temperature attained in the donor element is lowered and/or the transfer temperature (i.e., temperature attained at the transfer layer/LTHC interface or transfer layer/interlayer interface) is raised, relative to a homogeneous LTHC layer that has the same thickness and optical density. Advantages can include the ability to use imaging conditions that can lead to improved transfer properties (e.g., transfer sensitivity) without damaging the donor element or transferred pattern due to overheating of the donor.

Thermal mass transfer donor elements can include an LTHC layer that has an absorption coefficient that varies with thickness. Such an LTHC layer can be made by any suitable technique. For example, two or more layers can be sequentially coated, laminated, or otherwise formed, each of the layers having a different absorption coefficient, thereby forming an overall non-homogeneous LTHC layer. The boundaries between the layers can be gradual (e.g., due to diffusion between the layers) or abrupt. Non-homogeneous LTHC layers can also be made by diffusing material into a previously formed layer to create an absorption coefficient that varies with thickness. Examples include diffusing an absorber material into a binder, diffusing oxygen into a thin aluminum layer, and the like.

Suitable methods for making non-homogeneous LTHC layers include, but are not limited to: (i) sequentially coating two or more layers that have absorber material dispersed in a crosslinkable material, each layer having a different absorption coefficient, and either crosslinking after each coating step or crosslinking multiple layers together after coating all the pertinent layers; (ii) sequentially vapor depositing two or more layers that have different absorption coefficients; (iii) sequentially forming two or more layers that have different absorption coefficients, at least one of the layers including an absorber material disposed in a binder and at least one of the layers being vapor deposited; (iv) sequentially extruding one or more layers, each layer having an absorber material disposed in a binder; (v) extruding a multiple layer stack of at least two layers, at least two of the layers having absorber material dispersed therein to have different absorption coefficients; (vi) sequentially coating two or more layers that have absorber material dispersed in a binder, each layer having a different absorption coefficient; (vii) sequentially coating two or more layers that have absorber material, each layer having a different absorption coefficient, and at least one of the layers comprising a crosslinkable material and either crosslinking the corresponding layer(s) comprising the crosslinkable material after its respective coating step or subsequent to the coating of additional layers; and (viii) any suitable combination or permutation of the above.

Examples of non-homogeneous LTHC layers that can be made include the following: a two-layer structure that has a higher absorption coefficient in a deeper region; a two-layer structure that has a lower absorption coefficient in a deeper region; a three-layer structure that has an absorption coefficient that becomes sequentially larger with depth; a three-layer structure that has an absorption coefficient that becomes sequentially smaller with depth; a three-layer structure that has an absorption coefficient that becomes larger and then smaller with increasing depth; a three-layer structure that has an absorption coefficient that becomes smaller and then larger with increasing depth; and so on depending on the desired number of layers. With increasing numbers of regions having different absorption coefficients, and/or with thinner regions, and/or with increased diffusion between regions, a non-homogeneous LTHC layer can be formed that approximates a continuously varying absorption coefficient.

The LTHC layer can be used in a variety of thermal transfer elements, including thermal transfer elements that have a multi-component transfer assembly and thermal transfer elements that are used to transfer a single layer of a device or other item. The LTHC layer can be used with thermal transfer elements that are useful in forming multilayer devices, as described above, as well as thermal transfer elements that are useful for forming other items. Examples include such items as color filters, spacer layers, black matrix layers, printed circuit boards, displays (e.g., liquid crystal and emissive displays), polarizers, z-axis conductors, and other items that can be formed by thermal transfer including, for example, those described in U.S. Pat. Nos. 5,156,938; 5,171,650; 5,244,770; 5,256,506; 5,387,496; 5,501,938; 5,521,035; 5,593,808; 5,605,780; 5,612,165; 5,622,795; 5,685,939; 5,691,114; 5,693,446; and 5,710,097; and PCT Patent Applications Nos. 98/03346 and 97/15173.

Additional description of LTHC layers is provided in U.S. patent application Ser. No. 11/246,811, entitled "Radiation Curable Thermal Transfer Elements," and filed Oct. 7, 2005, which is incorporated herein by reference.

Optional Interlayer

An interlayer may be included as an optional element in the thermal transfer element. The optional interlayer may be used to minimize damage and contamination of the transferred portion of the transfer layer and may also reduce distortion in the transferred portion of the transfer layer. The interlayer may also influence the adhesion of the transfer layer to the thermal transfer element or otherwise control the release of the transfer layer in the imaged and non-imaged regions. Typically, the interlayer has high thermal resistance and does not distort or chemically decompose under the imaging conditions, particularly to an extent that renders the transferred image non-functional. The interlayer typically is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (e.g., solvent coating or spray coating). Typically, the glass transition temperature ($T_g$) of thermoplastic materials suitable for use in the interlayer is 25° C. or greater. In some cases the glass transition temperature ($T_g$) of thermoplastic materials suitable for use in the interlayer is 50° C. or greater. In other cases the glass transition temperature ($T_g$) of thermoplastic materials suitable for use in the interlayer is 100° C. or greater. In still further cases the glass transition temperature ($T_g$) of thermoplastic materials suitable for use in the interlayer is preferably 150° C. or greater.

The interlayer may be optically transmissive, optically absorbing, optically reflective, or some combination thereof, at the imaging radiation wavelength. Optionally, the thermal transfer donor element may comprise several interlayers. In some cases, the thermal transfer donor may comprise several interlayers (for example, it can include one or more of the following: both a reflective and transmissive interlayer; multiple transmissive interlayers; multiple reflective interlayers; an absorbing and a reflective interlayer; an absorbing and a transmissive interlayer; or multiple absorbing interlayers, etc.) which have different optical properties, the sequencing of which would be dependent upon the imaging and end-use application requirements.

Inorganic materials suitable as interlayer materials include, for example, metals, metal oxides, metal sulfides, and inorganic carbon coatings, including those materials that are highly transmissive or reflective at the imaging light wavelength. In some cases, the thermal transfer donor element may comprise several interlayers, (for example, it can include one or more of the following: both an inorganic and organic interlayer; multiple organic interlayers; or multiple inorganic interlayers), the sequencing of which would be dependent upon the imaging and end-use application requirements.

These materials may be applied to the light-to-heat-conversion layer via conventional techniques (e.g., vacuum sputtering, vacuum evaporation, or plasma jet deposition). The interlayer may provide a number of benefits. The interlayer may be a barrier against the transfer of material from the LTHC layer. It may also modulate the temperature attained in the transfer layer so that thermally unstable and/or temperature sensitive materials can be transferred. For example, the interlayer can act as a thermal diffuser to control the temperature at the interface between the interlayer and the transfer layer relative to the temperature attained in the LTHC layer. This may improve the quality (i.e., surface roughness, edge roughness, etc.) of the transferred layer. The presence of an interlayer may also result in improved plastic memory or decreased distortion in the transferred material.

The interlayer may contain additives, including, for example, photoinitiators, surfactants, pigments, plasticizers, and coating aids. The thickness of the interlayer may depend on factors such as, for example, the material of the interlayer, the material of the LTHC layer, the material of the transfer layer, the wavelength of the imaging radiation, and the duration of exposure of the thermal transfer element to imaging radiation. For polymer interlayers, the thickness of the interlayer typically is in the range of about 0.05 micron to about 10 microns, more preferably from about 0.1 micron to about 4 microns, more preferably from about 0.5 micron to about 3 microns, and more preferably from about 0.8 micron to about 2 microns. For inorganic interlayers (e.g., metal or metal compound interlayers), the thickness of the interlayer typically is in the range of about 0.005 micron to about 10 microns, more preferably, from about 0.01 micron to about 3 microns, and more preferably from about 0.02 micron to about 1 micron.

Additional information regarding interlayers is described in U.S. Pat. No. 5,725,989 and U.S. Published Application No. 2005/0287315, both of which are incorporated herein by reference.

Transfer Layer

A transfer layer is typically included in the thermal transfer element. A transfer layer is generally formed overlaying the LTHC layer, for example, by evaporation, sputtering or solvent coating, by coating as a uniform layer, or by printing in a pattern using digital printing (e.g., digital inkjet or digital electrophotographic printing), lithographic printing or evaporation or sputtering though a mask. As noted previously, other optional layers, for example, an optional interlayer, may be interposed between the optional LTHC layer and the transfer layer.

A transfer layer typically includes one or more layers for transfer to a receptor. These layers may be formed using organic, inorganic, organometallic, and other materials, including, for example, an electroluminescent material or electronically active material. Although the transfer layer is described and illustrated as having discrete layers, it will be appreciated that, at least in some instances, there may be an interfacial region that includes at least a portion of each layer. This may occur, for example, if there is mixing of the layers or diffusion of material between the layers before, during, or after transfer of the transfer layer. In other instances, two layers may be completely or partially mixed before, during, or after transfer of the transfer layer. In some cases, the outermost (that is, contacting) layers of both the donor and receptor comprise at least one common material. In other cases, the outermost (that is, contacting) layers of both the donor and receptor have essentially the same composition.

One example of a transfer layer includes a multi-component transfer assembly that is used to form a multilayer device, such as an active or passive device, on a receptor. In some cases, the transfer layer may include all of the layers needed for the active or passive device. In other instances, one or more layers of the active or passive device may be provided on the receptor, the remaining layers being included in the transfer layer. Alternatively, one or more layers of the active or passive device may be disposed onto the receptor after the transfer layer has been deposited. In some instances, the transfer layer is used to form only a single layer of the active or passive device or a single or multiple layer of an item other than a device. One advantage of using a multi-component transfer assembly, particularly if the layers do not mix, is that the important interfacial characteristics of the layers in the multi-component transfer assembly can be produced when the thermal transfer assembly is prepared and, preferably, retained during transfer. Individual transfer of layers may result in less optimal interfaces between layers.

The thermal transfer element can include a transfer layer that can be used to form, for example, electronic circuitry, resistors, capacitors, diodes, rectifiers, electroluminescent lamps, memory elements, field effect transistors, bipolar transistors, unijunction transistors, metal oxide semiconductor (MOS) transistors, metal-insulator-semiconductor transistors, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, cut-off filters, and the like), mirrors, splitters, couplers, combiners, modulators, sensors (e.g., evanescent sensors, phase modulation sensors, interferometric sensors, and the like), optical cavities, piezoelectric devices, ferroelectric devices, thin film batteries, or combinations thereof, for example, the combination of field effect transistors and organic electroluminescent lamps as an active matrix array for an optical display. Other items may be formed by transferring a multi-component transfer assembly and/or a single layer.

Examples of transfer layers that can be selectively patterned from thermal mass transfer donor elements include transfer layers which include colorants (e.g., pigments and/or dyes dispersed or dissolved in a binder), polarizers, liquid crystal materials, particles (e.g., spacers for liquid crystal displays, magnetic particles, insulating particles, conductive particles), emissive materials (e.g., inorganic phosphors and/or organic electroluminescent materials), hydrophobic materials (e.g., partition banks for ink jet receptors), hydrophilic materials, multilayer stacks (e.g., multilayer device constructions such as organic electroluminescent devices), microstructured or nanostructured layers, photoresist, metals, polymer containing layers, adhesives, binders, enzymes or other bio-materials, or other suitable materials or combination of materials. Examples of transfer layers are disclosed in the following documents: U.S. Pat. Nos. 5,691,098; 6,214,520; 6,291,126; 5,278,023; 5,308,737; 5,521,035; 5,685,939; 5,693,446; 5,695,907; 5,710,097; 5,725,989; 5,863,860; 5,998,085; 6,114,088; 6,194,119; 6,221,543; 6,228,543; 6,228,555; 6,242,152; 6,284,425; 6,358,664; 6,461,775; 6,461,787; 6,468,715; 6,482,564; 6,485,884; 6,521,324; 6,586,153; 6,699,597; 6,855,384; 6,855,636; and 5,521,035; International Publication Nos. WO 97/15173, WO 98/03346, and WO 99/46961; and co-assigned U.S. patent application Ser. Nos. 09/231,724; 09/312,504; 09/312,421; and 09/392,386, all of which are incorporated herein by reference.

Particularly well-suited transfer layers include materials that are useful in optical devices suitable for display applications. Thermal mass transfer can be performed to pattern one or more materials on a receptor with high precision and accuracy using fewer processing steps than for photolithography-based patterning techniques and thus can be especially useful in applications such as display manufacture. For example, transfer layers can be made so that, upon thermal transfer to a receptor, the transferred materials form color filters, black matrix, spacers, barriers, partitions, polarizers, retardation layers, wave plates, organic conductors or semi-conductors, inorganic conductors or semi-conductors, organic electroluminescent layers (fluorescent and/or phosphorescent), phosphor layers, organic electroluminescent devices, organic transistors, and other such elements, devices, or portions thereof that can be useful in displays, alone or in combination with other elements that may or may not be patterned in a like manner.

The transfer layer can be pre-patterned on the donor element and all, or part, of the pre-patterned transfer layer is transferred to the receptor via the radiation induced imaging process. Various layers (e.g., an adhesion layer) may be coated onto the transfer layer to facilitate transfer of the transfer layer to the substrate. In some cases, the transfer layer may comprise one or more materials that absorb imaging radiation. This is particularly useful when the donor does not comprise an optional separate LTHC layer.

LITI Patterning

For thermal transfer using radiation (e.g., light), a variety of radiation-emitting sources can be used. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power (e.g., ≧100 mW) single mode laser diodes, fiber-coupled laser diodes, and diode-pumped solid state lasers (e.g., Nd:YAG and Nd:YLF). Laser exposure dwell times can be in the range from, for example, about 0.1 microsecond to 100 microseconds and laser fluences can be in the range from, for example, about 0.01 J/cm$^2$ to about 1 J/cm$^2$.

When high spot placement accuracy is required (e.g., for high information full color display applications) over large substrate areas, a laser is particularly useful as the radiation source. Laser sources are compatible with both large rigid substrates such as 1 meter (m)×1 m×1.1 mm glass, and continuous or sheeted film substrates, such as 100 microns thick polyimide sheets.

Thermal Transfer to a Receptor

During imaging, the thermal transfer element is typically brought into proximity to a receptor for imaging and transfer of a portion of the transfer layer to the receptor. In at least some instances, pressure or vacuum may be used to hold the thermal transfer element in intimate contact with the receptor. A radiation source may then be used to heat the LTHC layer (and/or other layer(s) containing imaging radiation absorber material) in an image-wise fashion (e.g., digitally or by analog exposure through a mask) to perform image-wise transfer of the transfer layer from the thermal transfer element to the receptor according to a pattern in order to form, for example, an organic microelectronic device.

Typically, the transfer layer is transferred to the receptor without transferring any of the other layers of the thermal transfer element, such as the optional interlayer and the LTHC layer. Preferably, the adhesive and cohesive forces in the donor and receptor coatings are configured such that the transfer layer is transferred in the radiation exposed regions and is not transferred in the non-exposed regions. In some instances, a reflective interlayer can be used to attenuate the level of imaging radiation transmitted through the interlayer and reduce any damage to the transferred portion of the transfer layer that may result from interaction of the transmitted radiation with the transfer layer and/or the receptor. This effect is particularly beneficial in reducing thermal damage that may occur when the transfer layer and/or the receptor is highly absorptive of the imaging radiation.

During laser exposure, it may be desirable to minimize formation of interference patterns due to multiple reflections from the imaged material, which can be accomplished by various methods. The most common method is to effectively roughen the surface of the thermal transfer element on the scale of the incident radiation as described in U.S. Pat. No. 5,089,372. This roughening has the effect of disrupting the spatial coherence of the incident radiation, thus minimizing self interference. An alternate method is to employ an antireflection coating within the thermal transfer element on either, or both, sides of the substrate. The use of anti-reflection coatings is known and may be implemented with quarter-wave thicknesses of a coating such as magnesium fluoride, as described in U.S. Pat. No. 5,171,650, which is incorporated herein by reference.

Large thermal transfer elements can be used, including thermal transfer elements that have length and width dimensions of a meter or more. In operation, a laser can be rastered or otherwise moved across the large thermal transfer element, the laser being selectively operated to illuminate portions of the thermal transfer element according to a desired pattern. Alternatively, the laser may be stationary and the thermal transfer element moved beneath the laser.

In some instances, it may be necessary, desirable, and/or convenient to sequentially use two or more different thermal transfer elements to form a device. For example, one thermal transfer element may be used to form a gate electrode of a field effect transistor and another thermal transfer element may be used to form the gate insulating layer and semiconducting layer, and yet another transfer layer may be used to form the source and drain contacts. A variety of other combinations of two or more thermal transfer elements can be used to form a device, each thermal transfer element forming one or more layers of the device. Each of these thermal transfer elements may include a multi-component transfer assembly or may only include a single layer for transfer to the receptor. The two or more thermal transfer assemblies are then sequentially used to deposit one or more layers of the device. In some instances, at least one of the two or more thermal transfer elements includes a multi-component transfer assembly.

Receptors

The receptor substrate may be any item suitable for a particular application including, but not limited to, glass, transparent films, reflective films, metals, semiconductors, various papers, and plastics. For example, receptor substrates may be any type of substrate or display element suitable for display applications. Receptor substrates suitable for use in displays such as liquid crystal displays or emissive displays include rigid or flexible substrates that are substantially transmissive to visible light. Examples of rigid receptor substrates include glass, coated glass (for example, indium tin oxide coated glass), low temperature polysilicon (LTPS), and rigid plastic.

Suitable flexible substrates include substantially clear and transmissive polymer films, reflective films, non-birefringent films, transflective films, polarizing films, multilayer optical films, and the like. Suitable polymer substrates include polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports in various imaging arts. Transparent polymeric film base of 2 mils to 100 mils (i.e., 0.05 mm to 2.54 mm) is preferred.

For glass receptor substrates, a typical thickness is 0.2 mm to 2.0 mm. It is often desirable to use glass substrates that are 1.0 mm thick or less, or even 0.7 mm thick or less. Thinner substrates result in thinner and lighter weight displays. However, certain processing, handling, and assembling conditions may require thicker substrates. For example, some assembly conditions may require compression of the display assembly to fix the positions of spacers disposed between the substrates. The competing concerns of thin substrates for lighter displays and thick substrates for reliable handling and processing can be balanced to achieve a preferred construction for particular display dimensions.

If the receptor substrate is a polymeric film, it may be preferred that the film be non-birefringent to substantially prevent interference with the operation of the display in which it is to be integrated, or it may be preferred that the film be birefringent to achieve desired optical effects. Exemplary non-birefringent receptor substrates are polyesters that are solvent cast. Typical examples of these are those derived from polymers consisting or consisting essentially of repeating, interpolymerized units derived from 9,9-bis-(4-hydroxyphenyl)-fluorene and isophthalic acid, terephthalic acid or mixtures thereof, the polymer being sufficiently low in oligomer (i.e., chemical species having molecular weights of about 8000 or less) content to allow formation of a uniform film. This polymer has been disclosed as one component in a thermal transfer receiving element in U.S. Pat. No. 5,318,938. Another class of non-birefringent substrates are amorphous polyolefins (e.g., those sold under the trade designation Zeonex® from Nippon Zeon Co., Ltd.). Exemplary birefringent polymeric receptors include multilayer polarizers or mirrors such as those disclosed in U.S. Pat. Nos. 5,882,774 and 5,828,488, and in International Publication No. WO 95/17303.

Various layers (e.g., an adhesive layer) may be coated onto the final receptor substrate to facilitate transfer of the transfer layer to the receptor substrate. Other layers may be coated on the final receptor substrate to form a portion of a multilayer device. For example, an organic light emitting diode (OLED) or other electronic device may be formed using a receptor substrate having a metal anode or cathode formed on the receptor substrate prior to transfer of the transfer layer from the thermal transfer element. This metal anode or cathode may be formed, for example, by deposition of a conductive layer on the receptor substrate and patterning of the layer into one or more anodes or cathodes using, for example, photolithographic techniques.

Other layers necessary for operation of a device can be a part of the receptor, such as a hole injection layer and a hole transport layer. Therefore, the term "receptor" refers to a substrate optionally with additional layers forming part of an end device. In some cases, the receptor comprises a radiation absorber.

Microelectronic Device Fabrication with LITI Donors

A variety of electronic and optical devices can be fabricated using LITI donor films. In some instances, multiple thermal transfer elements may be used to form a device or other object. The multiple thermal transfer elements may include thermal transfer elements with multi-component transfer assemblies and thermal transfer elements that transfer a single layer. For example, a device or other object may be formed using one or more thermal transfer elements with multi-component transfer assemblies and one or more thermal transfer elements that transfer a single layer.

The multilayer device formed using the multi-component transfer assembly of the transfer layer may be, for example, an electronic or optical device. Examples of such devices include electronic circuitry, resistors, capacitors, diodes, rectifiers, electroluminescent lamps, electroluminescing devices, memory elements, field effect transistors, bipolar transistors, unijunction transistors, MOS transistors, metal-insulator-semiconductor transistors, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, cut-off filters, and the like), mirrors, splitters, couplers, combiners, modulators, sensors (e.g., evanescent sensors, phase modulation sensors, interferometric sensors, and the like), optical cavities, piezoelectric devices, ferroelectric devices, thin film batteries, or combinations thereof. Other electrically conductive devices that can be formed include, for example, electrodes and conductive elements.

A transfer layer can include a multi-component transfer assembly used to form at least a portion of a passive or active device. As an example, the transfer layer can include a multi-component transfer assembly that is capable of forming at least two layers of a multilayer device. These two layers of the multilayer device often correspond to two layers of the transfer layer. In this example, one of the layers that is formed by transfer of the multi-component transfer assembly is an active layer (i.e., a layer that acts as a conducting, semi-conducting, superconducting, waveguiding, frequency multiplying, light producing (e.g., luminescing, light emitting, fluorescing, or phosphorescing), electron producing, or hole producing layer in the device and/or as a layer that produces an optical or electronic gain in the device.)

A second layer that is formed by transfer of the multi-component transfer assembly is another active layer or an operational layer (i.e., a layer that acts as an insulating, conducting, semiconducting, superconducting, waveguiding, frequency multiplying, light producing (e.g., fluorescing or phosphorescing), electron producing, hole producing, light absorbing, reflecting, diffracting, phase retarding, scattering, dispersing, or diffusing layer in the device and/or as a layer that produces an optical or electronic gain in the device). The multi-component transfer assembly may also be used to form additional active layers and/or operational layers, as well as, non-operational layers (i.e., layers that do not perform a function in the operation of the device but are provided, for example, to facilitate transfer of a transfer assembly to a receptor substrate and/or adhere the transfer assembly to the receptor substrate).

The transfer layer may include an adhesive layer disposed on an outer surface of the transfer layer to facilitate adhesion to the receptor. The adhesive layer may be an operational layer, for example if the adhesive layer conducts electricity between the receptor and the other layers of the transfer layer, or a non-operational layer, for example if the adhesive layer only adheres the transfer layer to the receptor. The adhesive layer may be formed using, for example, thermoplastic polymers, including conducting and non-conducting polymers, conducting and non-conducting filled polymers, and/or conducting and non-conducting dispersions. Examples of suitable polymers include acrylic polymers, polyanilines, polythiophenes, poly(phenylenevinylenes), polyacetylenes, and other conductive organic materials such as those listed in Handbook of Conductive Molecules and Polymers, Vols. 1-4, H. S. Nalwa, ed., John Wiley and Sons, Chichester (1997), incorporated herein by reference. Examples of suitable conductive dispersions include inks containing carbon black, graphite, ultrafine particulate indium tin oxide, ultrafine antimony tin oxide, and commercially available materials from companies such as Nanophase Technologies Corporation (Burr Ridge, Ill.) and Metech (Elverson, Pa.). The adhesive layer may comprise a radiation absorber.

Although the transfer layer may be formed with discrete layers, the transfer layer may include layers that have multiple components and/or multiple uses in the device. Also, two or more discrete layers may be melted together during transfer or otherwise mixed or combined.

OLED Fabrication

The transfer of a multi-component transfer assembly to form at least a portion of an OLED provides an illustrative, non-limiting example of the formation of an active device using a thermal transfer element. An example of a multicomponent transfer unit is described in U.S. Pat. No. 6,410,201, which is incorporated herein by reference. In at least some instances, an OLED device includes a thin layer or layers of suitable organic materials sandwiched between a cathode and an anode. Electrons are injected into the organic layer(s) from the cathode and holes are injected into the organic layer(s) from the anode. As the injected charges migrate towards the oppositely charged electrodes, they may recombine to form electron-hole pairs which are typically referred to as excitons. These excitons, or excited state species, may emit energy in the form of light as they decay back to a ground state (see, e.g., T. Tsutsui, MRS Bulletin, 22, 39-45 (1997), incorporated herein by reference).

Illustrative OLED constructions are known to those skilled in the art (see, e.g., Organic Electroluminescence, Zakya Kafafi (ed.), CRC Press, NY, 2005). Illustrative examples of OLED constructions include molecularly dispersed polymer devices where charge carrying and/or emitting species are dispersed in a polymer matrix (see J. Kido "Organic Electroluminescent devices Based on Polymeric Materials", Trends in Polymer Science, 2, 350-355 (1994), incorporated herein by reference), conjugated polymer devices (PLED) where layers of polymers such as polyphenylene vinylene act as the charge carrying and emitting species (see J. J. M. Halls et al., Thin Solid Films, 276, 13-20 (1996), incorporated herein by reference), vapor coated small molecule (VCSM) heterostructure devices (see U.S. Pat. No. 5,061,569 and C. H. Chen et al., "Recent Developments in Molecular Organic Electroluminescent Materials", Macromolecular Symposia, 125, 1-48 (1997), incorporated herein by reference), light emitting electrochemical cells (see Q. Pei et al., J. Amer. Chem. Soc., 118, 3922-3929 (1996), incorporated herein by reference), and vertically stacked organic light-emitting diodes capable of emitting light of multiple wavelengths (see U.S. Pat. No. 5,707,745 and Z. Shen et al., Science, 276, 2009-2011 (1997), incorporated herein by reference). The emission of light of different colors may be achieved by the use of different emitters and dopants in the electron transport/emitter layer 206 (see C. H. Chen et al., "Recent Developments in Molecular Organic Electroluminescent Materials", Macromolecular Symposia, 125, 1-48 (1997), incorporated herein by reference).

Other OLED multilayer device constructions may be transferred using different transfer layers. The multilayer assembly can be transferred onto a receptor to form OLEDs. For example, green OLEDs can be transferred onto the receptor substrate. Subsequently, blue OLEDs and then red OLEDs may be transferred. Each of the green, blue, and red OLEDs are transferred separately using green, blue, and red thermal transfer elements, respectively, to form display sub-pixels. Alternatively, the red, green, and blue thermal transfer elements can be transferred on top of one another to create a multi-color stacked OLED device of the type disclosed in U.S. Pat. No. 5,707,745, incorporated herein by reference.

After formation, the OLED is typically coupled to a driver and sealed to prevent damage. The thermal transfer element can be a small or a relatively large sheet coated with the appropriate transfer layer. The use of laser light or other similar light-emitting sources for transferring these devices permits the formation of narrow lines and other shapes from the thermal transfer element. A laser or other light source could be used to produce a pattern of the transfer layer on the receptor, including receptors that may be meters in length and width.

Treatments Related to OLED Lifetimes

Embodiments described in the present specification may be used to enable higher LITI device efficiency and longer operation lifetimes. LITI technology is well suited for high-resolution patterning of OLED materials with patterned feature sizes equal or below 100 microns and patterning accuracy of ±2 microns or less, for example. LITI VCSM OLEDs are particularly attractive since this class of OLEDs consistently demonstrates superior performance.

Two major types of OLEDs, VCSM OLEDs and PLEDs, impose somewhat different requirements on the construction of HIL(s). Since PLEDs are coated from organic solutions either by conventional spin- or dip-coating or by inkjet, it is very common that PEDOT-type HIL is used in such devices. On the other hand, it is widely preferred that vacuum-coated SM OLEDs include only vacuum-coated layers including the HIL(s) because of the simplicity of fabrication and excellent operation stability of such devices. Although PEDOT-type HILs have been explored for VCSM OLEDs as well, they generally yield devices with relatively short lifetimes. An additional consideration of using PEDOT for high-resolution patterned OLEDs is that certain types of PEDOT, which demonstrate relatively long lifetimes in VCSM OLEDs, also possess relatively high conductivity, causing unacceptable cross-talk in high-resolution OLEDs.

Solution-coated HIL(s) may be desired in certain manufacturing processes. Solution-coated HILs may be required on substrate geometry that does not allow preparing all-vacuum coated device without short-circuiting. For example, such substrate geometries may be required in low-resolution OLEDs on glass or flexible substrates. Solution-coated HIL(s) may also be preferred in high-resolution VCSM OLEDs fabricated with LITI.

The modifications, according to certain embodiments and as described in the Examples, have shown the following effects on VCSM LITI OLEDs:

1. The LITI device/process modification, according to certain embodiments, leads to reduction in LITI mura defects variety and quantity, near elimination of LITI device dark spots formed as imperfections at receptor layer/transfer layer interfaces, and some reduction in the number of defects.

2. The modifications improve LITI OLED initial efficiencies and lead to lower device operation voltages. Both improvements allow for a lower power consumption device.

3. The improvements also lead to longer LITI device lifetimes.

4. Improved operation lifetimes of VCSM OLEDs with PEDOT and other organic solution-coated HIL(s) is achieved.

5. Described HIL structure can be used as a receptor in LITI VCSM OLEDs.

6. Described HIL structure can be used on rough ITO morphology to prevent short circuiting of OLEDs on such substrates.

Although specific examples of materials are mentioned above, embodiments have been demonstrated on a number of different materials set combinations, for example with a hole transport material as HTL1 or αNPB (HWSands Corp., Jupiter, Fla., U.S.A.) as HTL2. In one embodiment, it is essential that HTL1 is a polymeric or oligomeric hole-transport material processed from an organic solvent solution.

Demonstrated improved lifetimes are due to thermal annealing of an HIL structure that includes the following two layers: water dispersion coated polythiophene (PEDOT) layer and a second layer coated from an organic solvent. Annealing can serve to "fill in" defects on particular layers. Annealing can be performed on the transfer layer before transfer, on the transfer layer after transfer, on the receptor before transfer, or any combination thereof. One embodiment with particularly advantageous benefits involves annealing the receptor both before and after transfer of a transfer layer, as illustrated in the Examples.

The invention will now be described with reference to the following non-limiting Examples.

EXAMPLES

| Term | Meaning |
|---|---|
| BAlQ | Bis-(2-methyl-8-quinolato)-4-(phenyl-phenalato)-Aluminum, available from H. W. Sands Corp, Jupiter, FL |
| AlQ | Tris(8-hydroxyquinoline) aluminum available from H. W. Sands Corp, Jupiter, FL |
| LiF | Lithium fluoride, 99.85%, available from Alfa Aesar, Ward Hill, MA as product number 36359 |
| Al | Puratronic aluminum shots, 99.999%, available from Alfa Aesar, Ward Hill, MA |
| Ag | Silver (target available from Arconium, Providence RI) |
| ITO | Indium tin oxide |
| OEL | Organic electroluminescent |
| OLED | Organic light emitting diode |
| LCD | Liquid Crystal Display |
| RPM | Revolutions per minute |
| Ebecryl 629 | Epoxy novolac acrylate available from UCB Radcure Inc., N. Augusta, SC |
| Irgacure 184 | 1-hydroxycyclohexyl phenyl ketone available from Ciba Specialty Chemicals Corporation, Tarrytown, NY, as Irgacure 184 |
| PET | Polyethylene terephthalate |
| PEDOT VP CH 8000 | A mixture of water and 3,4-polyethylenedioxythiophene-polystyrenesulfonate (cationic) available from H. C. Starck, Newton, MA |
| Elvacite 2669 | An acrylic resin available from ICI Acrylics Inc., Memphis, TN |
| Irgacure 369 | 2-benzyl-2-(dimethylamino)-1-(4-(morpholinyl)phenyl) butanone, available from Ciba Specialty Chemicals Corporation, Tarrytown, NY |
| MEK | Methyl Ethyl Ketone |
| PMA | 1-methoxy-2-propanol acetate |
| PM | 1-methoxy-2-propanol |
| UV | Ultraviolet |
| nm | Nanometer |
| kW | Kilowatt |
| um, μ | Micrometer/micron |
| kV | Kilovolt |
| sccm | Standard cubic centimeters per minute |
| AFM | Atomic Force Microscopy |
| SR 351HP | Trimethylolpropane triacrylate ester, available from Sartomer, Exton, PA as SR 351HP |
| LITI | Laser-induced thermal imaging |
| LTHC | Light-to-heat conversion |
| IL | Interlayer |
| Raven 760 Ultra | Carbon black pigment, available from Columbian Chemical Co., Atlanta, GA |
| Butvar B-98 | Polyvinyl butyrol resin, available from Solutia, Inc., St. Louis, MO |
| Joncryl 67 | Acrylic resin available from S. C. Johnson & Sons, Racine, WI |
| Disperbyk 161 | A dispersant available from Byk-Chemie, USA, Wallingford, CT |
| Wt. % | Weight percent |
| Ketjenblack EC600JD | Carbon black pigment, available from Akzo Nobel Polymer Chemicals, Chicago, Illinois |
| Vylon UR8300 | Urethane modified copolyester resin, available from DKSH North America, Inc, Baltimore, MD |
| BR-95 | Acrylic copolymer, available from Dianal America, Inc, Pasadena, TX |
| Aronix M-310 | Trimethylolpropane polypropylene glycol triacrylate, available from Toagosei America, Dublin, OH |
| M7Q | PET film, 2.88 mil thickness available from DuPont Teijin Films, Hopewell, VA |
| OD | Optical Density |
| HTL | Hole transport layer |
| HIL | Hole injection layer |
| HTM | Hole transport material |
| VCSM | Vacuum-coated small molecule |
| SM | Small molecule |

Example 1

Comparative

This example demonstrates LITI OLED performance before implementing process/device modifications described above in comparison to corresponding conventional vacuum-coated control device.

The following control vacuum-coated device (CONV device) was prepared (device 1.1):

ITO/PEDOT CH8000/1TNATA/sTAD/triplet host:Irppy/BAlq/Alq/LiF/Al/Ag, according to the procedure described in Table 1.

TABLE 1

Device 1.1

| Device Layers | Coating Procedure |
|---|---|
| PEDOT CH8000 | Spin-coated to yield 60 nm dry film thickness, annealed at 200° C. for 5 minutes under N2. |
| 1TNATA | Vacuum coated at 0.1 nm/s (nanometers/second) to yield 20 nm thick film |
| sTAD | Vacuum coated at 0.1 nm/s to yield 20 nm thick film |
| triplet host:Irppy | triplet host vacuum coated at 0.1 nm/s to yield 30 nm thick film co-deposited with Irppy at 9% Irppy concentration |
| BAlq | Vacuum coated at 0.05 nm/s to yield 10 nm thick film |
| Alq | Vacuum coated at 0.1 nm/s to yield 20 nm thick film |
| LiF | Vacuum coated at 0.02 nm/s to yield 1.5 nm thick film |
| Al | Vacuum coated at 0.03 nm/s to yield 4 nm thick film |
| Ag | Vacuum coated at 0.5 nm/s to yield 400 nm thick film |

The following LITI OLED was been prepared (device 1.2):

ITO/PEDOT CH8000/1TNATA/sTAD/triplet host:Irppy/BAlq/Alq/LiF/Al/Ag, according to the procedure described in Table 2.

TABLE 2

Device 1.2

| Device Layers | Coating Procedure |
|---|---|
| PEDOT CH8000 | Spin-coated to yield 60 nm dry film thickness, annealed at 200° C. for 5 minutes under N2. |
| 1TNATA | Vacuum coated at 0.1 nm/s to yield 20 nm thick film |
| sTAD | Vacuum coated at 0.1 nm/s to yield 20 nm thick film |
| triplet host:Irppy | triplet host vacuum coated at 0.1 nm/s to yield 30 nm thick film co-deposited with Irppy at 9% Irppy concentration; the layer was coated onto standard LITI donor sheet (interlayer thickness 1.8 μm) and transferred onto ITO/PEDOT CH8000/1TNATA/sTAD receptor in the laser power range between 1 W and 8 W at imaging plane |
| BAlq | Vacuum coated at 0.05 nm/s to yield 10 nm thick film |
| Alq | Vacuum coated at 0.1 nm/s to yield 20 nm thick film |
| LiF | Vacuum coated at 0.02 nm/s to yield 1.5 nm thick film |
| Al | Vacuum coated at 0.03 nm/s to yield 4 nm thick film |
| Ag | Vacuum coated at 0.5 nm/s to yield 400 nm thick film |

Devices 1.1 and 1.2 yielded green electroluminescence corresponding to Irppy emission with $\lambda_{max}$ at 510 nm and CIE coordinates of 0.28, 0.63. Performance of devices 1.1 and 1.2 is summarized in Table 3. Lower efficiency, higher initial operation voltage, much lower lifetimes and steeper voltage creep with time are observed in these LITI devices.

TABLE 3

OLED performance data for PEDOT CH8000/1TNATA/sTAD/triplet host:Irppy/BAlq/Alq/cathode, CONV and LITI

| Device | Device Type | Eff @ 500 nits, Cd/A* | V @10 mA/cm2, V** | Δτ½ @L0 500nits, hours*** | ΔV @__½, V**** |
|---|---|---|---|---|---|
| 1.1 | CONV | 24 | 6.7 | 2500 | ≧0.8 |
| 1.2 | LITI | 11.5 | 7.6 | 150 | ≧1.5 |

*typical error in efficiency data is ±5-10%;

**typical error in voltage data is ±5-10%;

***typical error in lifetime data (both Δτ½ and ΔV) is ±10-20%;

****ΔV values are used with ≧ symbol since, unlike for Δτ½, no reliable accelerated testing model exists for ΔV.

Lower performance of LITI devices correlates with their electroluminescence patterns, which show in optical microscopy multiple defects of the following types: electroluminescence black spots centered around particulates on receptor surfaces; black spots corresponding to poor receptor-transfer layer interface; LITI line cracking at ITO feature edges; dark diffuse electroluminescence areas ("watermark" defects); and overall grainy electroluminescence with gradient of intensity across linewidth.

Example 2

This example demonstrates performance of Irppy green and a red dopant red LITI devices fabricated after implementing process/device modifications described above (in comparison to corresponding conventional vacuum-coated control device).

The following green and red control vacuum-coated devices (CONV devices) were prepared (devices 2.1 and 2.2):

ITO/PEDOT CH8000/hole transport material/sTAD/triplet host:Irppy(triplet host:red dopant/BAlq/Alq/LiF/Al/Ag, according to the procedure described in Table 4.

TABLE 4

Devices 2.1 and 2.2

| Device Layers | Coating Procedure |
|---|---|
| PEDOT CH8000 | Spin-coated to yield 60 nm dry film thickness, annealed at 200° C. for 5 minutes under N2. |

TABLE 4-continued

Devices 2.1 and 2.2

| Device Layers | Coating Procedure |
|---|---|
| hole transport material | Spin-coated to yield 100 nm dry film thickness, annealed on hot plate at 115° C. hot-plate surface temperature for 10 minutes under glovebox argon atmosphere. |
| sTAD | Vacuum coated at 0.1 nm/s to yield 20 nm thick film |
| triplet host:Irppy(2.1) triplet host: red dopant (2.2) | triplet host vacuum coated at 0.1 nm/s to yield 30 nm thick film co-deposited with Irppy or red dopant at 9% concentration |
| BAlq | Vacuum coated at 0.05 nm/s to yield 10 nm thick film |
| Alq | Vacuum coated at 0.1 nm/s to yield 20 nm thick film |
| LiF | Vacuum coated at 0.02 nm/s to yield 1.5 nm thick film |
| Al | Vacuum coated at 0.03 nm/s to yield 4 nm thick film |
| Ag | Vacuum coated at 0.5 nm/s to yield 400 nm thick film |

The following green and red LITI devices (LITI devices) were prepared (device 2.3 and 2.4):

ITO/PEDOT CH8000/hole transport material/sTAD/triplet host:Irppy(triplet host:red dopant)/BAlq/Alq/LiF/Al/Ag, according to the procedure described in Table 5.

TABLE 5

Devices 2.3 and 2.4

| Device Layers | Coating Procedure |
|---|---|
| PEDOT CH8000 | Spin-coated to yield 60 nm dry film thickness, annealed at 200° C. for 5 minutes under N2. |
| hole transport material | Spin-coated to yield 100 nm dry film thickness, annealed on hot plate at 115° C. hot-plate surface tempeature for 10 minutes under glovebox argon atmosphere. |
| sTAD | Vacuum coated at 0.1 nm/s to yield 20 nm thick film |
| triplet host:Irppy(2.3) triplet host:red dopant (2.4) | triplet host vacuum coated at 0.1 nm/s to yield 30 nm thick film co-deposited with Irppy or red dopant at 90% concentration; the layer was coated onto standard LITI donor sheet (interlayer thickness 1.8 μm) and transferred onto ITO/PEDOT CH8000/hole transport material/sTAD receptor in the laser power range between 1W and 8W at imaging plane; after transfer the LITI-imaged structure was annealed on hot plate at 115° C. hot-plate surface temperature for 10 minutes under glovebox argon atmosphere. |
| BAlq | Vacuum coated at 0.05 nm/s to yield 10 nm thick film |
| Alq | Vacuum coated at 0.1 nm/s to yield 20 nm thick film |
| LiF | Vacuum coated at 0.02 nm/s to yield 1.5 nm thick film |
| Al | Vacuum coated at 0.03 nm/s to yield 4 nm thick film |
| Ag | Vacuum coated at 0.5 nm/s to yield 400 nm thick film |

Table 6 summarizes device performance for this example. It demonstrates that introduced process/device modifications improved both initial LITI device performance and lifetimes; LITI lifetimes increased to ca. 1100 h for green pixels operated at initial brightness of 500 nits and ca. 5000 h for red pixels operated at initial brightness of 200 nits. Observed improvements correlate with improved electroluminescence patterns in LITI devices. For example, electroluminescence black spots defects produced due to imperfections at the receptor-transfer layer interface have been essentially eliminated, LITI line cracking at the ITO feature edges was substantially reduced, and some reduction in "watermarks" defects was observed as well.

TABLE 6

OLED performance data for PEDOT CH8000/hole transport material/sTAD/triplet host:Irppy (triplet host:red dopant)/BAlq/Alq/cathode, CONV and LITI

| Device | Device type | CIE | Eff @ 500 nits, Cd/A* | V @10 mA/cm2, V** | Δτ½ hours*** | ΔV @_½, V**** |
|---|---|---|---|---|---|---|
| 2.1 | CONV | 0.28, 0.63 | 24-28 Cd/A | 5.5 V | 4500 | ≧1 V |
| 2.3 | LITI | 0.28, 0.63 | 19-23 Cd/A | 5.5 V | 1100 | ≧1.5 V |
| 2.2 | CONV | 0.68, 0.32 | 4-5 Cd/A | 6.5 V | 20000 | ≧1 V |
| 2.4 | LITI | 0.68, 0.32 | 3.5-4 Cd/A | 6.5 V | 5000 | ≧1.5 V |

*typical error in efficiency data is ±5-10%;
**typical error in voltage data is ±5-10%;
***at L0 500 nits for green and 200 nits for red, typical error in lifetime data (both Δτ½ and ΔV) is ±10-20%;
****ΔV values are used with ≧ symbol since, unlike for Δτ½, no reliable accelerated testing model exists for ΔV.

Example 3

This example demonstrates that VCSM OLEDs comprising PEDOT HIL and organic solution-coated HIL combined with all other layers prepared in vacuum show noticeably improved operation lifetimes if the HIL structure is annealed prior to vacuum layers deposition. It also shows that thermal annealing of such two-layer solution-coated HIL significantly reduces voltage creep with time.

The following devices were prepared:

ITO/PEDOT CH8000/hole transport material/sTAD/triplet host:Irppy/BAlq/Alq/LiF/Al/Ag (device 3.1); and ITO/PEDOT CH8000/hole transport material*/sTAD/triplet host:Irppy/BAlq/Alq/LiF/Al/Ag (device 3.2), according to the procedure described in Table 7 (*annealed PEDOT CH8000/hole transport material).

TABLE 7

Devices 3.1 and 3.2

| Device Layers | Coating Procedure, Device 3.1 | Coating Procedure, Device 3.2 |
|---|---|---|
| PEDOT CH8000 | Spin-coated to yield 60 nm dry film thickness, annealed at 200° C. for 5 minutes under N2 | Spin-coated to yield 60 nm dry film thickness, annealed at 200° C. for 5 minutes under N2 |
| hole transport material | Spin-coated to yield 100 nm dry film thickness | Spin-coated to yield 100 nm dry film thickness, annealed at 115° C. for 10 minutes under Argon |
| sTAD | Vacuum coated at 0.1 nm/s to yield 20 nm thick film | Vacuum coated at 0.1 nm/s to yield 20 nm thick film |
| triplet host:Irppy | triplet host vacuum coated at 0.1 nm/s to yield 30 nm thick film co-deposited with Irppy at 9% Irppy concentration | triplet host vacuum coated at 0.1 nm/s to yield 30 nm thick film co-deposited with Irppy at 9% Irppy concentration |
| BAlq | Vacuum coated at 0.05 nm/s to yield 10 nm thick film | Vacuum coated at 0.05 nm/s to yield 10 nm thick film |
| Alq | Vacuum coated at 0.1 nm/s to yield 20 nm thick film | Vacuum coated at 0.1 nm/s to yield 20 nm thick film |
| LiF | Vacuum coated at 0.02 nm/s to yield 1.5 nm thick film | Vacuum coated at 0.02 nm/s to yield 1.5 nm thick film |
| Al | Vacuum coated at 0.03 nm/s to yield 4 nm thick film | |
| Ag | Vacuum coated at 0.5 nm/s to yield 400 nm thick film | Vacuum coated at 0.5 nm/s to yield 400 nm thick film |

Device performance for examples 1-3 (initial efficiency and voltage at 500 Cd/m2 luminance as well as device lifetime at specified driving current density) is shown in Table 8.

TABLE 8

Summary of performance of OLEDs described in Examples 1-3

| | Initial Performance | | Lifetimes Data | |
|---|---|---|---|---|
| Device Type | Efficiency at 500 nits, Cd/A | Voltage at 500 nits, Cd/A | Time to ½ luminance at initial luminance of 500 nits, $T_{1/2}$, hours | Voltage creep during $T_{1/2}$, V |
| 1.1 | 20 ± 1 | 5.9 ± 0.3 | 1050 ± 100 | 0.3 |
| 2.1 | 18.5 ± 0.8 | 5.1 ± 0.2 | 750 ± 100 | 5 |
| 2.2 | 19 ± 0.7 | 5.1 ± 0.2 | 1300 ± 150 | 3.5 |
| 3.1 | 18 ± 1 | 5.1 ± 0.2 | 750 ± 70 | 3 |
| 3.2 | 18 ± 1 | 5.1 ± 0.2 | 2100 ± 100 | 1 |

We demonstrated that the annealed two layer HIL construction, including PEDOT and an organic solution-coated HIL, exhibits improved lifetimes and noticeably stabilized voltage with time. The combination of the two HILs as well as thermal annealing processing step were found to be essential in achieving these results and may allow for using solution-coated HILs for VCSM OLEDs. The Irppy devices, according to certain embodiments, show lifetimes of ca. 8000 h at initial luminance of 500 Cd/m2 (extrapolated).

Example 4

For this example, the following LITI OLEDs were prepared (triplet host:Irppy is a LITI-transferred layer):

TO/PEDOT CH8000/hole transport material/sTAD/triplet host:Irppy/BAlq/Alq/LiF/Al/Ag (device X.1);

ITO/PEDOT CH8000/hole transport material/sTAD/triplet host:Irppy*/BAlq/Alq/LiF/Al/Ag (device X.2); and ITO/PEDOT CH8000/hole transport material*/sTAD/triplet host:Irppy*/BAlq/Alq/LiF/Al/Ag (device X.3), according to the procedures described in Table 9 (*annealed layers). Donor film implemented in this example belongs to 03091101 YS-coated roll. Laser imaging conditions were in the 0.8-0.9 J/cm$^2$ dose range at laser power of 1 W at imaging plane.

Table 10 summarizes lifetime performance of the prepared LITI devices. Lifetime tests were set-up in a continuous DC driving mode with a driving current of 3.5 mA/cm$^2$ for all devices. Lifetimes at 500 nits were obtained by using the following accelerated lifetime relationship previously verified on this type of structures:

$$\text{Lifetime at } J_1 = \text{lifetime at } J_0 \times (J_0/J_1)^{1.6}$$

or $$\text{Lifetime at } L_1 = \text{lifetime at } L_0 \times (L_0/L_1)^{1.6}$$

The results suggest that LITI devices prepared without annealing of either receptor or transfer layer show the poorest initial efficiency and lifetime. For example, operation lifetime of devices of type X.1 is ca. 480 hours at driving current of 3.5 mA/cm$^2$ and 440 hours if normalized to initial luminance of 500 nits.

If annealing of the LITI layer (triplet host:Irppy) is implemented (devices X.2), lifetime increases to ca. 620 hours and 730 hours at driving current of 3.5 mA/cm$^2$ and initial luminance of 500 nits. If further receptor layers are annealed prior to sTAD deposition as well as LITI transferred triplet host: Irppy layer is annealed after, even larger improvement in LITI device lifetime is observed. Thus, devices X.3 show lifetimes of ca. 780 hours and 940 hours at 3.5 mA/cm$^2$ and 500 nits, respectively.

Thus, this example confirms that improvements in LITI OLED lifetimes are observed even upon single additional thermal annealing step (ca. 50-60% improvement), i.e. annealing LITI transferred structure after transfer. Lifetimes are further improved if receptor layers (CH8000/hole transport material in this example) are annealed prior to LITI too (more than 100% improvement compare to devices made without annealing process steps).

TABLE 9

| | Devices X.1, X.2, and X.3 | | |
|---|---|---|---|
| Device layers | Coating procedure, Device X.1 | Coating procedure, Device X.2 | Coating procedure, Device X.3 |
| PEDOT CH8000 | Spin-coated to yield 60 nm dry film thickness, annealed at 200° C. for 5 minute under N2. | Spin-coated to yield 60 nm dry film thickness, annealed at 200° C. for 5 minutes under N2. | Spin-coated to yield 60 nm dry film thickness, annealed at 200° C. for 5 minutes under N2. |
| hole transport material | Spin-coated to yield 100 nm dry film thickness, no annealing | Spin-coated to yield 100 nm dry film thickness, annealed at 115° C. for 10 min under Argon | Spin-coated to yield 100 nm dry film thickness, annealed at 115° C. for 10 min under Argon |
| sTAD | Vacuum coated at 0.1 nm/s to yield 20 nm thick film | Vacuum coated at 0.1 nm/s to yield 20 nm thick film | Vacuum coated at 0.1 nm/s to yield 20 nm thick film |
| triplet host:Irppy | triplet host vacuum coated onto donor at 0.1 nm/s to yield 30 nm thick film co-deposited with Irppy at 9% Irppy concentration, LITI transferred, no annealing | triplet host vacuum coated onto donor at 0.1 nm/s to yield 30 nm thick film co-deposited with Irppy at 9% Irppy concentration, LITI transferred, no annealing | triplet host vacuum coated onto donor at 0.1 nm/s to yield 30 nm thick film co-deposited with Irppy at 9% Irppy concentration, LITI transferred, annealed at 115° C. for 10 minutes under Argon |
| BAlq | Vacuum coated at 0.05 nm/s to yield 10 nm thick film | Vacuum coated at 0.05 nm/s to yield 10 nm thick film | Vacuum coated at 0.05 nm/s to yield 10 nm thick film |
| Alq | Vacuum coated at 0.1 nm/s to yield 20 nm thick film | Vacuum coated at 0.1 nm/s to yield 20 nm thick film | Vacuum coated at 0.1 nm/s to yield 20 nm thick film |
| LiF | Vacuum coated at 0.02 nm/s to yield 1.5 nm thick film | Vacuum coated at 0.02 nm/s to yield 1.5 nm thick film | Vacuum coated at 0.02 nm/s to yield 1.5 nm thick film |
| Al | Vacuum coated at 0.03 nm/s to yield 4 nm thick film | Vacuum coated at 0.03 nm/s to yield 4 nm thick film | Vacuum coated at 0.03 nm/s to yield 4 nm thick film |
| Ag | Vacuum coated at 0.5 nm/s to yield 400 nm thick film | Vacuum coated at 0.5 nm/s to yield 400 nm thick film | Vacuum coated at 0.5 nm/s to yield 400 nm thick film |

TABLE 10

| Summary of Performance for Devices X.1, X.2, and X.3 | | | | | |
|---|---|---|---|---|---|
| device | process | Sqrt (life) @ 3.5 | lifetime at 3.5 mA/ cm2, hours | L @ 3.5 mA/ cm2, nits | lifetime @ 500 nits, hours |
| X.1 | no annealing | 22 | 484 | 470 | 440 |
| X.2 | LITI annealed | 25 | 625 | 550 | 730 |
| X.3 | receptor annealed, LITI annealed | 28 | 784 | 560 | 940 |

The invention claimed is:

1. A process for transferring an image onto a receptor, comprising the steps of:

providing on a substrate a light-to-heat conversion layer and a transfer layer coated on the light-to-heat conversion layer, the transfer layer including an organic material;

placing the transfer layer in contact with a surface of the receptor;

irradiating the light-to-heat conversion layer in an imagewise pattern with a light source to thermally transfer portions of the transfer layer corresponding to the imagewise pattern to the receptor, forming on the receptor organic interfaces between the transferred portions and the receptor;

annealing at least one layer on the receptor prior to the irradiating step; and annealing the portions of the transfer layer after transfer to the receptor, the annealing comprising applying a thermal treatment to the organic interfaces before applying additional layers to the transferred portions, the thermal treatment being sufficient to reduce defects within the organic interfaces.

2. The process of claim 1, further comprising performing the annealing in an inert or vacuum controlled environment.

3. The process of claim 1, further comprising disposing an interlayer between the light-to-heat conversion layer and the transfer layer prior to the placing step.

4. The process of claim 1, further comprising applying a hole injection layer on the receptor prior to the placing step.

5. The process of claim 4, further comprising annealing the hole injection layer prior to the irradiating step.

6. The process of claim 1, further comprising applying a hole transport layer on the receptor prior to the placing step.

7. The process of claim 6, further comprising annealing the hole transport layer prior to the irradiating step.

8. The process of claim 1, wherein the receptor comprises one of glass, a transparent film, or a liquid crystal display substrate.

* * * * *